United States Patent
Iwamoto et al.

(10) Patent No.: US 6,184,738 B1
(45) Date of Patent: Feb. 6, 2001

(54) INPUT BUFFER FOR SUPPLYING SEMICONDUCTOR DEVICE WITH INTERNAL SIGNAL BASED ON COMPARISON OF EXTERNAL SIGNAL WITH REFERENCE POTENTIAL

(75) Inventors: Hisashi Iwamoto, Hyogo; Aiko Nishino, Tokyo; Wataru Sakamoto, Hyogo, all of (JP)

(73) Assignees: Mitsubishi Denki Kabushiki Kaisha; Mitsubishi Electric Engineering Company Limited, both of Tokyo (JP)

( * ) Notice: Under 35 U.S.C. 154(b), the term of this patent shall be extended for 0 days.

(21) Appl. No.: 09/019,199

(22) Filed: Feb. 5, 1998

(30) Foreign Application Priority Data

Jun. 16, 1997 (JP) .................................................. 9-158760
Oct. 16, 1997 (JP) .................................................. 9-283590

(51) Int. Cl.[7] ....................................................... H03L 5/00
(52) U.S. Cl. ................................................................. 327/333
(58) Field of Search .................................... 327/318, 319, 327/328, 333, 52, 53, 56, 404, 545, 546, 185; 326/57

(56) References Cited

U.S. PATENT DOCUMENTS

| | | | |
|---|---|---|---|
| 4,618,785 | * 10/1986 | Van Tran | ............................. 327/333 |
| 5,212,455 | * 5/1993 | Pernici et al. | ......................... 330/253 |
| 5,568,073 | * 10/1996 | McClure | ................................. 327/51 |
| 5,739,726 | * 4/1998 | Ling | ......................................... 331/57 |
| 5,748,026 | * 5/1998 | Maekawa et al. | ..................... 327/333 |
| 5,805,005 | * 9/1998 | Raisinghani et al. | ................. 327/333 |
| 5,821,701 | * 10/1998 | Teggatz et al. | ....................... 315/307 |

OTHER PUBLICATIONS

"Development of Low–Cost and High–Speed Datea Transfer Circuit with the Aim of Spreading High–Speed Transfer Mode", M. Tagushi et al. Nikkei Microdevices Mar. 1993.

\* cited by examiner

*Primary Examiner*—My-Trang Nu Ton
(74) *Attorney, Agent, or Firm*—McDermott, Will & Emery (57) ABSTRACT

An input buffer of a semiconductor device is provided.

A first voltage shift circuit converts an input signal formed of a low amplitude logic signal overlapping 1.65V or 2.9V to a first signal formed of a complimentary signal formed of the low amplitude logic signal overlapping 2.9V or 1.65V. A second voltage shift circuit converts a reference potential of 1.65V or 2.9V to a second signal of 2.9V or 1.65V. A differential amplifier compares the reference potential with the input signal when the reference potential is 1.65V, and compares the first signal and the second signal when the reference potential is 2.9V. The input buffer thus operates normally whichever of 1.65V and 2.9V is the reference potential.

13 Claims, 9 Drawing Sheets

INPUT BUFFER FOR SUPPLYING SEMICONDUCTOR DEVICE WITH INTERNAL SIGNAL BASED ON COMPARISON OF EXTERNAL SIGNAL WITH REFERENCE POTENTIAL

BACKGROUND OF THE INVENTION

1. Field of the Invention

The present invention relates to an input buffer of a semiconductor device, and in particular, relates to an input buffer of a semiconductor device which compares an external reference potential with an external signal and supplies an internal signal to an internal circuit according to the result of the comparison.

2. Description of the Background Art

The recent increase in speed of the microprocessors accompanies the increase in the memory speed. Regarding data transmission between devices, a conventional interface of TTL (Transistor Transistor Logic) type has a limit on speed. Although the TTL type interface has no problem when the operating frequency is low, the overshoot and undershoot of an output signal becomes conspicuous when the operating frequency increases. Further, in the bus transmission system, irregularity of a signal due to reflection is a critical problem. Therefore, a high speed interface in which the amplitude of a signal is decreased is put into practical use.

Figure 10:
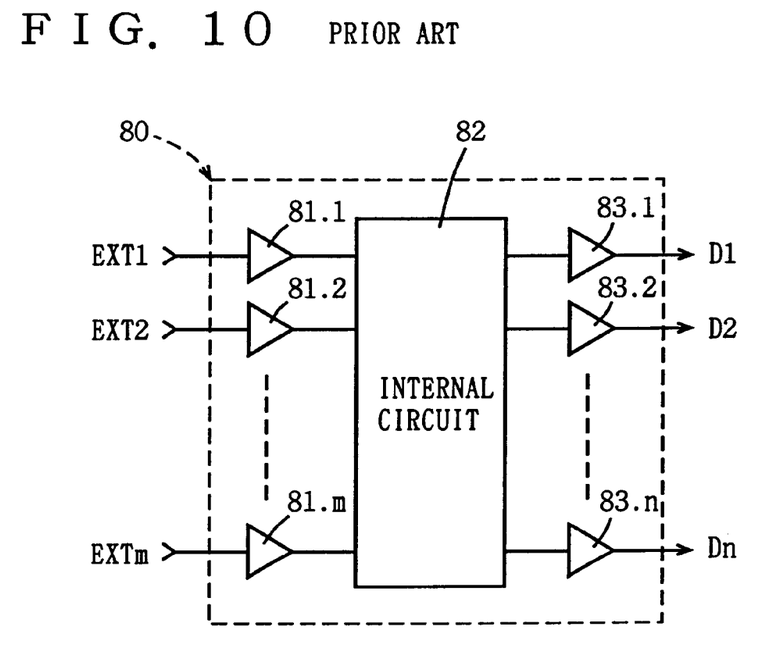
FIG. 10 is a partially omitted circuit block diagram illustrating a structure of a semiconductor integrated circuit device which employs a conventional LVTTL interface.

FIG. 10 is a partially omitted circuit block diagram showing a structure of a semiconductor integrated circuit device (eg. DRAM) which employs an LVTTL (Low Voltage Transistor Transistor Logic) interface which is an interface of TTL type.

With reference to FIG. 10, this semiconductor integrated circuit device includes input buffers 81.1–81.m, an internal circuit 82 and output buffers 83.1–83.n. Input buffers 81.1–81.m respectively receive external signals EXT1–EXTm, generate internal signals and supply them to internal circuit 82. Internal circuit 82 carries out a prescribed operation (writing and reading operation of data in the case of DRAM) according to the internal signals supplied from input buffers 81.1–81.m. Output buffers 83.1–83.n amplify signals D1–Dn generated in internal circuit 82 and output them to the outside.

Figure 11:
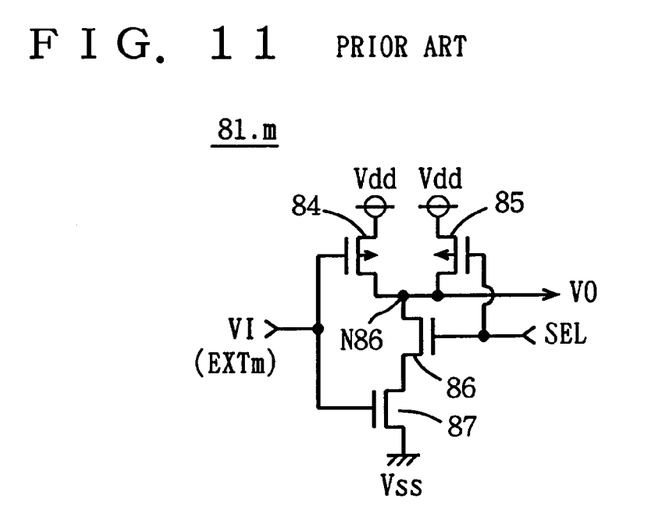
FIG. 11 is a circuit diagram showing an input buffer of FIG. 10.

FIG. 11 is a circuit diagram illustrating a structure of the input buffer 81.m shown in FIG. 10.

Referring to FIG. 11, input buffer 81.m includes P channel MOS transistors 84 and 85, and N channel MOS transistors 86 and 87. P channel MOS transistors 84 and 85 are connected between lines of power supply potential Vdd (3.3V) and an output node N86 respectively. N channel MOS transistors 86 and 87 are serially connected between output node N86 and a line of ground potential Vss. The gates of MOS transistors 84 and 87 receive an input signal VI (external signal EXTm), and the gates of MOS transistors 85 and 86 receive an activation signal SEL. Activation signal SEL is set to "L" level of a non-activation level in the standby mode (power down mode, sleep mode) of the semiconductor integrated circuit device in order to reduce consumption power. The potential at output node N86 is an output signal VO.

When activation signal SEL is at "L" level of the non-activation level, P channel MOS transistor 85 is rendered conductive, N channel MOS transistor 86 is rendered nonconductive, and output signal VO is fixed at "H" level irrespective of input signal VI. When activation signal SEL rises to "H" level of an activation level, P channel MOS transistor 85 is rendered nonconductive, N channel MOS transistor 86 is rendered conductive and input buffer 81.m is activated.

When input signal VI rises to "H" level (2V), P channel MOS transistor 84 is rendered nonconductive, N channel MOS transistor 87 is rendered conductive and output signal VO falls to "L" level. When input signal VI falls to "L" level (0.8V), P channel MOS transistor 84 becomes conductive, N channel MOS transistor 87 becomes nonconductive, and output signal VO rises to "H" level.

Figure 12:
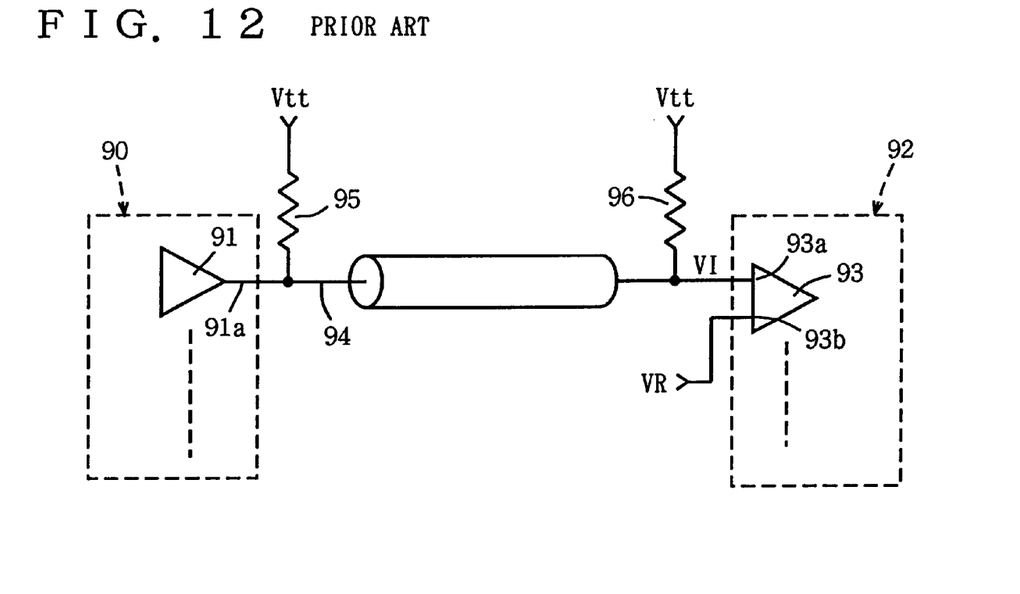
FIG. 12 is a partially omitted circuit block diagram provided for explaining a method of transmitting a signal between semiconductor integrated circuit devices that employ the conventional SSTL_3 interface.

FIG. 12 is a partially omitted circuit block diagram showing an SSTL_3 (Stub Series Terminated Logic for 3.3V) which is a high speed interface.

Referring to FIG. 12, in the SSTL_3 interface, an output node 91a of an output buffer 91 in a semiconductor integrated circuit device 90 of transmission side is connected with one input node 93a of an input buffer 93 in a semiconductor integrated circuit device 92 of reception side by a signal transmission line 94. Output node 91a of output buffer 91 and one input node 93a of input buffer 93 respectively receive terminal potential Vtt (1.65V) via resistance elements 95 and 96. The other input node 93b of input buffer 93 receives reference potential VR (1.65V).

Figure 13:
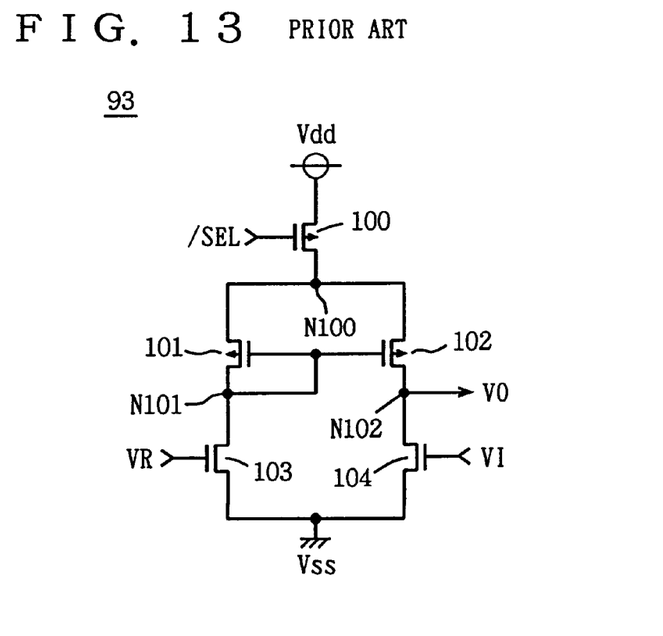
FIG. 13 is a circuit diagram illustrating an input buffer of FIG. 12.
Figure 14:
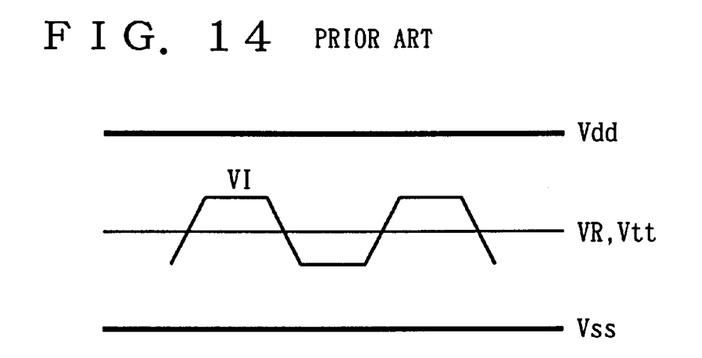
FIG. 14 is a waveform chart showing the relation between input signal VI, reference potential VR, terminal potential Vtt and power supply potential Vdd shown in FIG. 12.

As shown in FIG. 13, input buffer 93 is constituted by a differential amplifier, and includes P channel MOS transistors 100–102 and N channel MOS transistors 103 and 104. P channel MOS transistor 100 is connected between a line of power supply potential Vdd and a node N100, and its gate receives an activation signal/SEL. MOS transistors 101 and 103 as well as MOS transistors 102 and 104 are serially connected between node N100 and a line of ground potential Vss. Both gates of P channel MOS transistors 101 and 102 are connected to the drain (node N101) of P channel MOS transistor 101. P channel MOS transistors 101 and 102 constitute a current mirror circuit. The gates of N channel MOS transistors 103 and 104 respectively receive reference potential VR and input signal VI. N channel MOS transistors 103 and 104 constitute a pair of differential transistors. As shown in FIG. 14, input signal VI is a signal formed of a low amplitude logic signal overlapping reference potential VR, and oscillates between 1.65+0.4V and 1.65–0.4V. The potential at node N102 between P channel MOS transistor 102 and N channel MOS transistor 104 is output signal VO.

When activation signal/SEL is at "H" level of the non-activation level, P channel MOS transistor 100 becomes nonconductive, and output signal VO is fixed at "L" level irrespective of input signal VI. When activation signal/SEL falls to "L" level of the activation level, P channel MOS transistor 100 becomes conductive, current is supplied to nodes N101 and N102 respectively, and input buffer 93 is activated.

When input signal VI rises to "H" level (2.05V), the resistance value of N channel MOS transistor 104 becomes lower than that of N channel MOS transistor 103, and output signal VO falls to "L" level. When input signal VI falls to "L" level (1.25V), the resistance value of N channel MOS transistor 104 becomes higher than that of N channel MOS transistor 103, and the level of output signal VO becomes "H".

In the SSTL_3 interface, the smaller amplitude of the potential of signal transmission line 94 enables high speed transmission of the signal. In addition, the alternating current component of the consumption power can be reduced. The reduced consumption power of output buffer 91 allows output buffer 91 to be easily integrated.

A problem which arises in this case is as follows. In the SSTL_3 interface, the potential of signal transmission line 94 needs to be maintained at terminal potential Vtt, and consumption power for generating terminal potential Vtt from power supply potential Vdd (=Vdd/2) is required, resulting in increased consumption power in the entire system. This problem is especially critical in the system such as a portable device which is driven by a battery.

Figure 15:
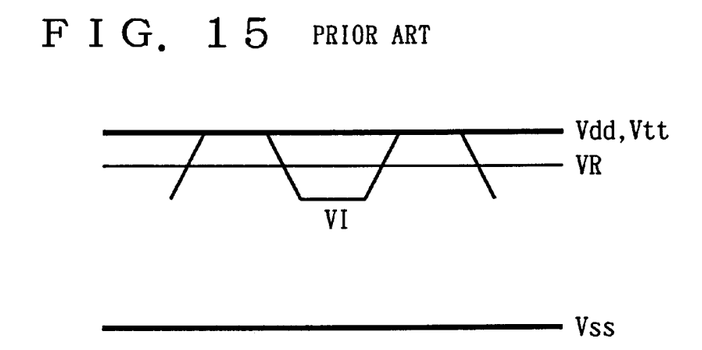
FIG. 15 is a waveform chart provided for explaining a proposed improvement of the SSTL_3 interface shown in FIG. 12.

According to a proposed method, terminal potential Vtt is set at power supply potential Vdd (3.3V), reference potential VR is set at 2.9V, and input signal VI is oscillated between 2.9+0.4V and 2.9−0.4V as shown in FIG. 15. This method does not require the consumption power for generating terminal potential Vtt, so that the consumption power in the entire system is reduced. However, this method is not applicable to high speed operation since terminal potential Vtt is not equal to reference potential VR, and variation of signal VI from "H" level to "L" level and that from "L" level to "H" level are not balanced.

Then another method is proposed. According to this method, when the system is driven by a battery, terminal potential Vtt is set at power supply potential Vdd, and priority is given to the reduction of consumption power over high speed operation. When the system is driven by the power from a socket not by a battery, terminal potential Vtt is set at an intermediate potential Vdd/2, and priority is given to the high speed operation over the reduction of consumption power.

Figure 16:
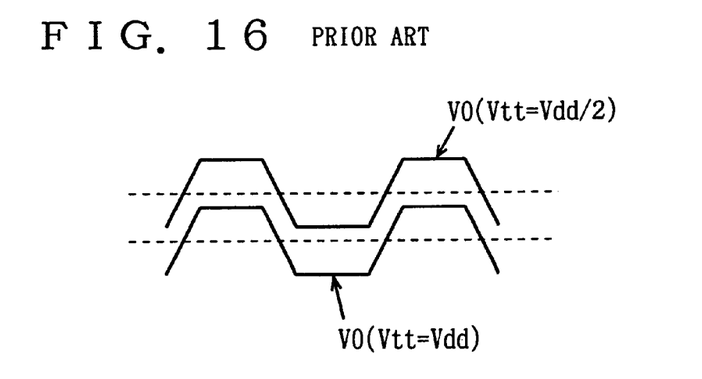
FIG. 16 is a waveform chart provided for explaining a problem of the proposed improvement shown in FIG. 15.

When terminal potential Vtt is set at power supply potential Vdd, and reference potential VR is set at 2.9V in input buffer 93 of FIG. 13, the resistance value of N channel MOS transistors 103 and 104 becomes smaller compared with the case in which terminal potential Vtt is set at intermediate potential Vdd/2 and reference potential VR is set at 1.65V. As a result, the intermediate level of the logic amplitude of output signal VO becomes lower and any malfunction occurs in internal circuit 82 as shown in FIG. 16.

SUMMARY OF THE INVENTION

An object of the present invention is to provide an input buffer of a semiconductor device which normally operates whichever of a first potential and a second potential is given as an external referential potential.

According to one aspect of the invention, a signal conversion circuit converts an external signal formed of a low amplitude logic signal overlapping a first potential or a second potential to a signal formed of a complimentary signal of the low amplitude logic signal overlapping the second or the first potential, and a potential conversion circuit converts the first or second potential supplied as an external reference potential to the second or the first potential. A differential amplifier constituted by the first to the fourth transistors and a current mirror circuit is structured such that it compares the external reference potential with an external signal when the reference potential is the first potential, and compares an output signal of the signal conversion circuit with an output potential of the potential conversion circuit when the reference potential is the second potential. Accordingly, whichever of the first and the second potential is the external reference potential, the device operates normally and the logic amplitude of an internal signal and its intermediate level are maintained at a constant value.

Preferably, the signal conversion circuit includes a first resistance element serially connected between lines of the first and second power supply potential, as well as a fifth transistor to which an external signal is input, and the potential conversion circuit includes a second resistance element serially connected between lines of the first and second power supply potential as well as a sixth transistor to which the external reference potential is input. Accordingly, the signal conversion circuit and the potential conversion circuit can be constituted easily.

Still preferably, a seventh transistor and an eighth transistor are serially connected in parallel with the serially connected first and second transistors, and a ninth transistor and a tenth transistor are serially connected in parallel with the serially connected third and fourth transistors. Input electrodes of the first and the eighth transistors, input electrodes of the second and the seventh transistors, input electrodes of the third and the tenth transistors, and input electrodes of the fourth and the ninth transistors are connected with each other. In this case, there is no difference of operational property due to the order of connection of the first to the fourth transistors between a case in which the reference potential is the first potential and the reference potential is the second potential, and the operational property becomes still more similar.

Preferably, a line of a third power supply potential to which the current mirror circuit is connected is the line of the first power supply potential. In this case, the structure of the input buffer circuit is simplified.

Preferably, the third power supply potential is a stabilized potential between the first and second power supply potentials. A stabilized potential generating circuit is further provided for generating the stabilized potential. In this case, a stable operation is carried out even if the power supply voltage varies.

According to another aspect of the invention, a first transistor is connected between a first node and a line of a second power supply potential, a second transistor is connected between a second node and a line of a second power supply potential, serially connected third and fourth transistors are connected in parallel with the first transistor, and serially connected fifth and sixth transistors are connected in parallel with the second transistor. An external reference potential is supplied to input electrodes of the first and the third transistors, an external signal is supplied to input electrodes of the second and the fifth transistors, and input electrodes of the fourth and the sixth transistors are connected to the first node. In this case, when the external reference potential changes from the first potential to the second potential and the potential at the first and the second nodes becomes lower, the resistance value of the fourth and the sixth transistors increases. As a result, the logic amplitude and its intermediate level of an internal signal are maintained at a constant value both in the cases in which the external reference potential is the first potential and the external reference potential is the second potential.

According to still another aspect of the invention, a first differential amplifier which outputs an intermediate level of a logic amplitude of an internal signal when the external reference potential is the first potential, as well as a second differential amplifier which outputs an intermediate level of a logic amplitude of an internal signal when the external reference potential is the second potential. When the external reference potential is the first potential, the first differential amplifier is activated, and the second differential amplifier is activated when the external reference potential is the second potential. Accordingly, normal operation can be achieved whichever of the first and the second potentials is the external reference potential, and an intermediate level of a logic amplitude of an internal signal is maintained at a constant value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figures 1, 2A, 2B:
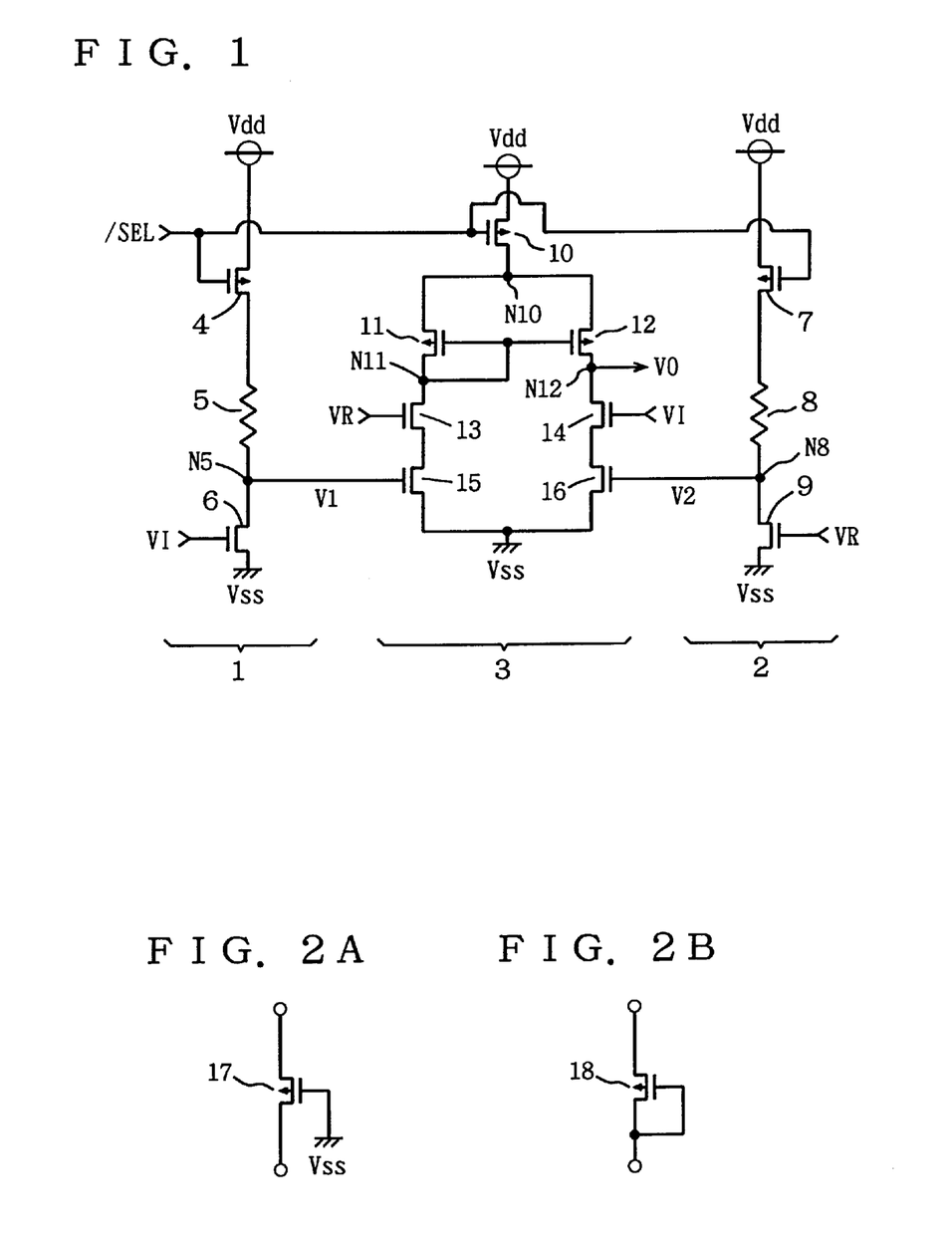
FIG. 1 is a circuit diagram illustrating a structure of an input buffer of a semiconductor integrated circuit device according to the first embodiment of the invention.
FIGS. 2A and 2B are circuit diagrams illustrating structures of resistance elements shown in FIG. 1.

FIG. 1 is a circuit diagram illustrating an input buffer of a semiconductor integrated circuit device according to the first embodiment of the invention. Referring to FIG. 1, the input buffer includes voltage shift circuits 1 and 2 and a differential amplifier 3.

Voltage shift circuit 1 includes a P channel MOS transistor 4 serially connected between a line of power supply potential Vdd and a line of ground potential Vss, a resistance element 5 and an N channel MOS transistor 6. The gate of P channel MOS transistor 4 receives activation signal/SEL. As shown in FIGS. 2A and 2B, resistance element 5 is constituted by a P channel MOS transistor 17 having its gate connected to the line of ground potential Vss, or a P channel MOS transistor 18 having its gate connected to its drain. The gate of N channel MOS transistor 6 receives an input signal VI. The potential at a node N5 between resistance element 5 and N channel MOS transistor 6 is an output signal V1.

If input signal VI is the one which is formed of a low amplitude logic signal overlapping intermediate potential Vdd/2 (1.65V), resistance value of N channel MOS transistor 6 varies at a relatively high level, and output signal V1 of voltage shift circuit 1 becomes a signal formed of a complimentary signal of the low amplitude logic signal overlapping 2.9V. If input signal VI is the one formed of the low amplitude logic signal overlapping 2.9V, the resistance value of N channel MOS transistor 6 varies at a relatively lower level, and output signal V1 of voltage shift circuit 1 is the one formed of a complimentary signal of the low amplitude logic signal overlapping 1.65V.

Voltage shift circuit 2 includes a P channel MOS transistor 7 serially connected between the line of power supply potential Vdd and the line of ground potential Vss, a resistance element 8 and an N channel MOS transistor 9. The gate of P channel MOS transistor 7 receives activation signal/SEL. Resistance element 8 is structured similarly to resistance element 5. The gate of N channel MOS transistor 9 receives reference potential VR. The potential at a node N8 between resistance element 8 and N channel MOS transistor 9 is an output signal V2 of voltage shift circuit 2.

When reference potential VR is 1.65V, resistance value of N channel MOS transistor 9 becomes relatively higher, and output signal V2 of voltage shift circuit 2 becomes 2.9V. When reference potential VR is 2.9V, resistance value of N channel MOS transistor 9 becomes relatively lower, and output signal V2 of voltage shift circuit 2 becomes 1.65V.

Differential amplifier 3 includes P channel MOS transistors 10–12 and N channel MOS transistors 13–16. P channel MOS transistor 10 is connected between the line of power supply potential Vdd and a node N10, and its gate receives activation signal/SEL. MOS transistors 11, 13 and 15 and MOS transistors 12, 14 and 16 are respectively serially connected between node N10 and the line of ground potential Vss. Gates of P channel MOS transistors 11 and 12 are both connected to the drain of P channel MOS transistor 11. P channel MOS transistors 11 and 12 constitute a current mirror circuit. The gates of N channel MOS transistors 13 and 14 respectively receive reference potential VR and input signal VI. Gates of N channel MOS transistors 15 and 16 respectively receive output signals V1 and V2 of voltage shift circuits 1 and 2. N channel MOS transistors 13 and 14 and N channel MOS transistors 15 and 16 each constitutes a pair of differential transistors. The potential at a node N12 between P channel MOS transistor 12 and N channel MOS transistor 14 becomes output signal VO.

The operation of this input buffer is next described. When activation signal/SEL is at "H" level of the nonactivation level, P channel MOS transistors 4, 7 and 10 are rendered nonconductive, so that the input buffer becomes in the nonactivation state. When activation signal/SEL falls to "L" level of the activation level, P channel MOS transistors 4, 7 and 10 are rendered conductive, and the input buffer is activated.

When terminal potential Vtt and reference potential VR are of intermediate potential Vdd/2 (1.65V) (the state of FIG. 14), levels of output signals V1 and V2 from voltage shift circuits 1 and 2 become higher, and resistance values of N channel MOS transistors 15 and 16 of differential amplifier 3 are decreased compared with those of N channel MOS transistors 13 and 14. Accordingly, in differential amplifier 3, reference potential VR and input signal VI that are directly input to MOS transistors 13 and 14 are dominant over output signals V1 and V2 of voltage shift circuits 1 and 2. As a result, the operation of the input buffer is similar to the operation of the input buffer shown in FIG. 13.

When terminal potential Vtt is equal to power supply potential Vdd (3.3V), and reference potential VR is 2.9V (the state of FIG. 15), the levels of output signals V1 and V2 of voltage shift circuits 1 and 2 become lower, and resistance values of N channel MOS transistors 13 and 14 of differential amplifier 3 become lower compared with resistance values of N channel MOS transistors 15 and 16. As a result, in differential amplifier 3, output signals V1 and V2 from voltage shift circuits 1 and 2 are dominant over reference potential VR and input signal VI directly input to MOS transistors 13 and 14.

If input signal VI is higher than reference potential VR, the level of signal V1 becomes lower than the level of signal V2, and output signal VO becomes "L" level. On the contrary, if input signal VI is lower than reference potential VR, the level of signal V1 becomes higher than the level of signal V2, and output signal VO becomes "H" level. Accordingly, the relation between input signal VI and output signal VO is similar to that in the input buffer shown in FIG. 13.

According to this embodiment, the input buffer compares, when reference potential VR is 1.65V, reference potential VR of 1.65V with input signal VI formed of the low amplitude logic signal overlapping 1.65V, and compares, when reference potential VR is 2.9V, signal V1 formed of a complimentary signal of the low amplitude logic signal overlapping 1.65V generated in voltage shift circuit 1 with signal V2 of 1.65V generated in voltage shift circuit 2. As a result, in both of the cases when reference potential VR is 1.65V and 2.9V, the input buffer operates normally, and the logic amplitude and its intermediate level of output signal VO is maintained at a constant value.

In the input buffer shown in FIG. 1, if external power supply potential Vdd varies, the value of the current flowing in the input buffer also varies, resulting in variation of time taken from input of input signal VI to output of output signal VO. This is not preferable since the set up time and hold time of input signal VI are increased. External power supply potential Vdd could be decreased to generate a stabilized potential and the stabilized potential could be used as a power supply potential of the input buffer. However, in the interface (see FIG. 15) having its terminal potential Vtt as power supply potential Vdd, if the stabilized potential generated by decreasing power supply potential Vdd is used as a power supply potential of the input buffer, the input buffer does not operate normally since the level of input signal VI is close to power supply potential Vdd.

Figure 3:
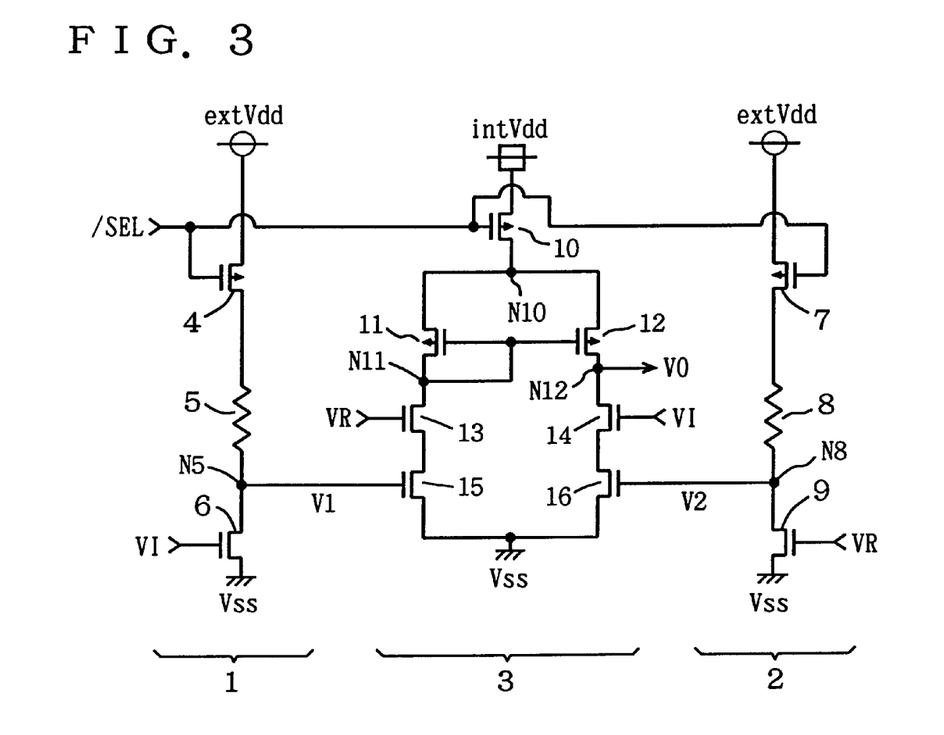
FIG. 3 is a circuit diagram showing an example of improvement of the input buffer shown in FIG. 1.
Figure 4:
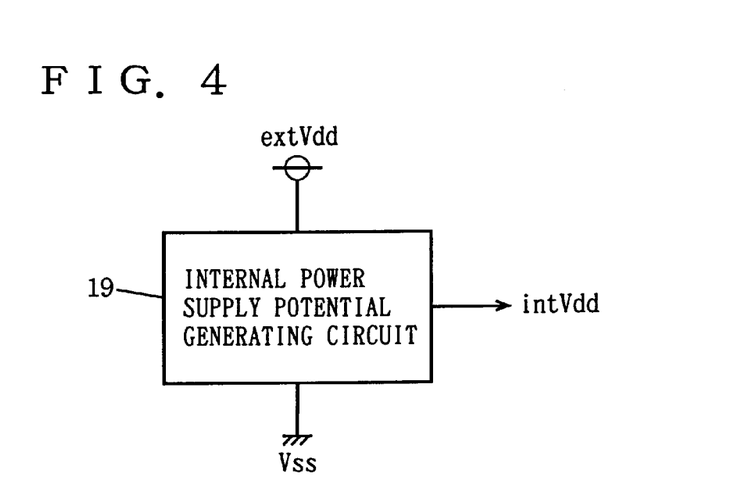
FIG. 4 is a block diagram showing a structure of an internal power supply potential generating circuit for generating the internal power supply potential shown in FIG. 3.

As shown in FIG. 3, external power supply potential extVdd is supplied to voltage shift circuits 1 and 2, and internal power supply potential intVdd which is the stabilized potential is supplied to differential amplifier 3. Internal power supply potential intVdd is generated by an internal power supply potential generating circuit 19 as shown in FIG. 4. Internal power supply potential generating circuit 19 is formed of a known stabilized potential generating circuit, receives external power supply potential extVdd and ground potential Vss and generates internal power supply potential intVdd by decreasing external power supply potential extVdd. Accordingly, the variation of the time taken from the input of input signal VI to the output of output signal VO where there is a variation of external power supply voltage extVdd is restrained.

Figure 5:
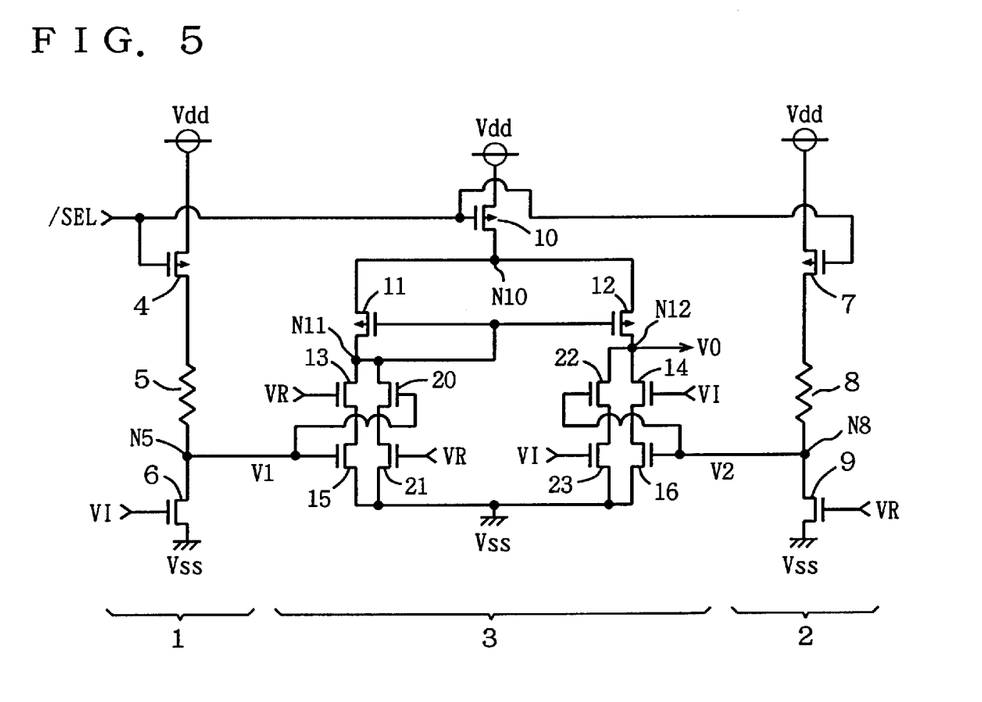
FIG. 5 is a circuit diagram showing another example of improvement of the input buffer shown in FIG. 1.
Figure 6:
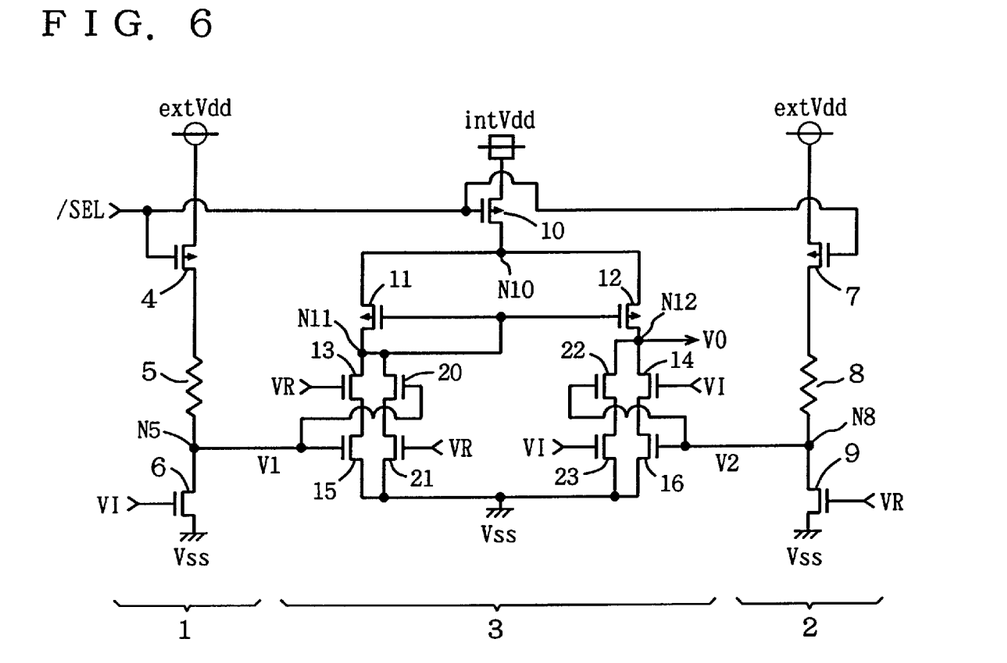
FIG. 6 is a circuit diagram showing still another example of improvement of the input buffer shown in FIG. 1.

As shown in FIG. 5, if N channel MOS transistors 20 and 21 are serially connected between node N11 and the line of ground potential Vss, N channel MOS transistors 22 and 23 are serially connected between node N12 and ground potential Vss, and V1, VR, V2 and VI are respectively supplied to gates of N channel MOS transistors 20–23, the difference of operational property between the case in which reference potential VR is 1.65V and the case in which reference potential VR is 2.9V due to the order of connection of N channel MOS transistors 13 and 15 as well as 14 and 16 can be prevented. As shown in FIG. 6, if internal power supply potential intVdd is supplied to differential amplifier 3 in the input buffer, the variation of the time taken from the input of input signal VI to the output of output signal VO where there is a variation of external power supply potential extVdd is restrained.

(Second Embodiment)

Figure 7:
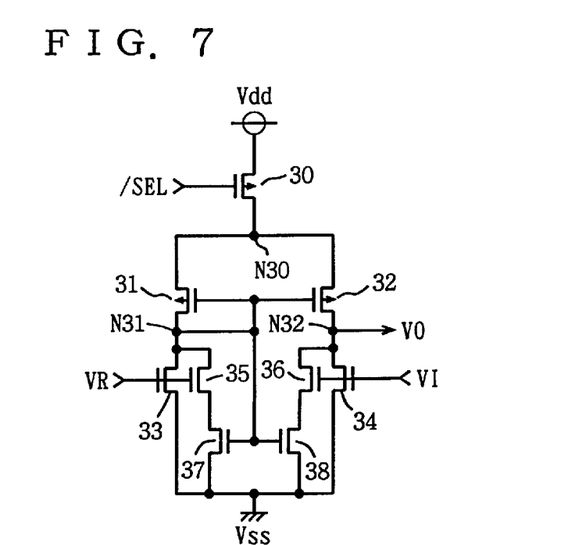
FIGS. 7–9 are circuit diagrams each showing a structure of an input buffer of a semiconductor integrated circuit device according to the second to the fourth embodiments of the invention.

FIG. 7 is a circuit diagram illustrating a structure of an input buffer of a semiconductor integrated circuit device according to the second embodiment.

With reference to FIG. 7, this input buffer includes P channel MOS transistors 30–32 and N channel MOS transistors 33–38. P channel MOS transistor 30 is connected between the line of power supply potential Vdd and a node N30, and its gate receives activation signal /SEL. MOS transistors 31 and 33 and MOS transistors 32 and 34 are respectively serially connected between node N30 and the line of ground potential Vss. N channel MOS transistors 35 and 37 are serially connected between the drain (node N31) of P channel MOS transistor 31 and the line of ground potential Vss. N channel MOS transistors 36 and 38 are serially connected between the drain (output node N32) of P channel MOS transistor 32 and the line of ground potential Vss. Gates of MOS transistors 31, 32, 37 and 38 are all connected to node N31. Gates of N channel MOS transistors 33 and 35 receive reference potential VR, and the gates of MOS transistors 34 and 36 receive input signal VI.

Next the operation of the input buffer is described below. The input buffer is activated when activation signal /SEL falls to "L" level of activation level.

When terminal potential Vtt and reference potential VR are equal to intermediate potential Vdd/2 (1.6V) (the state shown in FIG. 14), the resistance values of N channel MOS transistors 33–38 become relatively higher, and the input buffer operates similarly to the input buffer shown in FIG. 13.

When terminal potential Vtt is equal to power supply potential Vdd (3.3V), and reference potential VR is 2.9V (the state shown in FIG. 15), the resistance values of N channel MOS transistors 33, 34, 35 and 36 become relatively lower. When the potential at node N31 is becoming lower, resistance values of N channel MOS transistors 37 and 38 become higher, so that increase of the current flowing from nodes N31 and 32 to the line of ground potential Vss is restrained. Accordingly, variation of the logic amplitude and its intermediate level of output signal VO is made minor.

According to this embodiment, the same effect as that of the first embodiment can be obtained.

(Third Embodiment)

Figure 8:
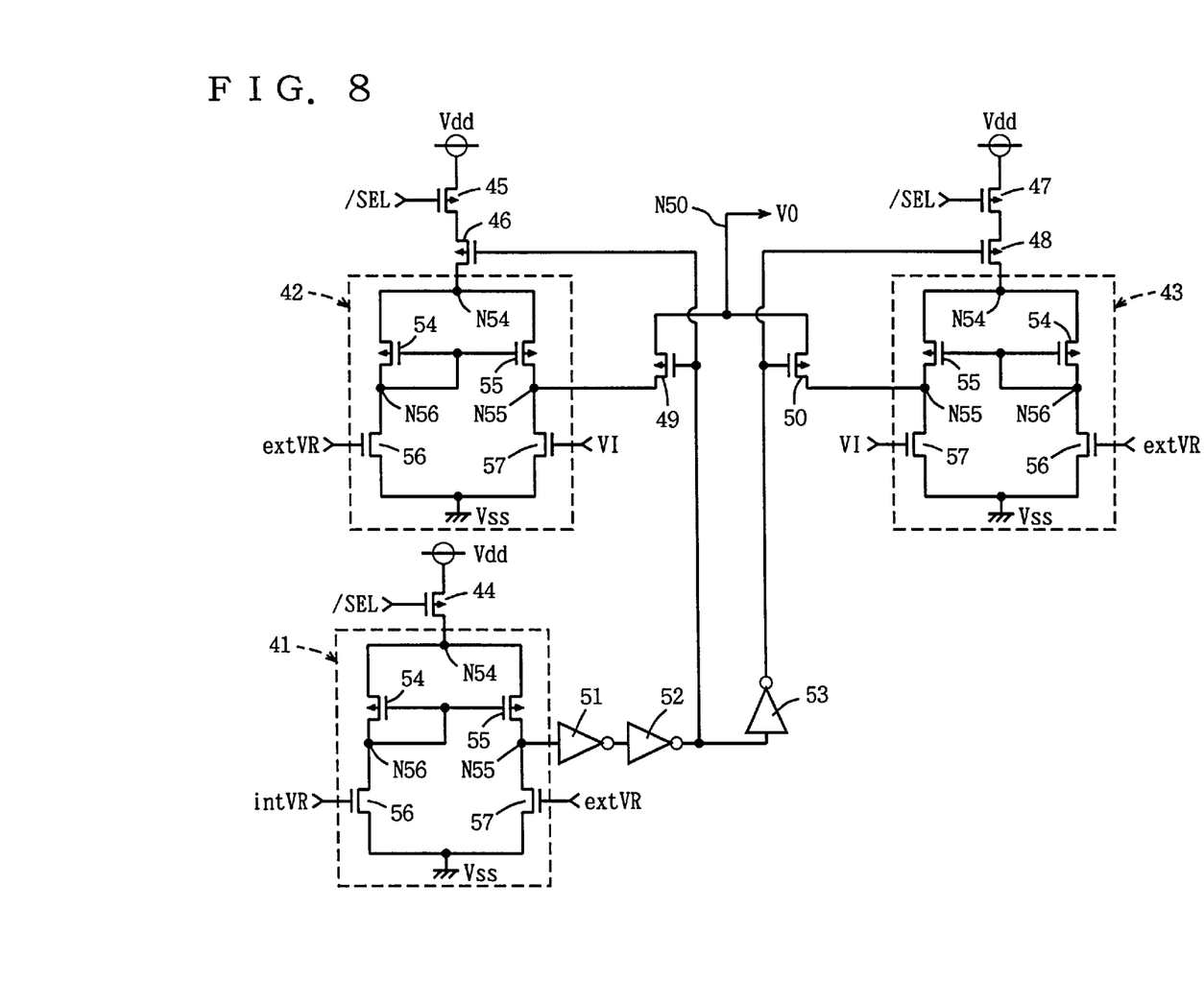

FIG. 8 is a circuit diagram illustrating an input buffer of a semiconductor integrated circuit device according to the third embodiment.

Referring to FIG. 8, this input buffer includes three differential amplifiers 41–43, P channel MOS transistors 44–50 and inverters 51–53. P channel MOS transistor 44 is connected between the line of power supply potential Vdd (3.3V) and a power supply node N54 of differential amplifier 41. P channel MOS transistors 45 and 46 are serially connected between the line of power supply potential Vdd and power supply node N54 of differential amplifier 42. P channel MOS transistors 47 and 48 are serially connected between the line of power supply potential Vdd and power supply node N54 of differential amplifier 43. P channel MOS transistors 49 and 50 are respectively connected between output nodes N55 of differential amplifiers 42 and 43 and an output node N50 of the input buffer. P channel MOS transistors 44, 45 and 47 have gates receiving activation signal/SEL. Output node N55 of differential amplifier 41 is connected to gates of P channel MOS transistors 46 and 49 via inverters 51 and 52, and connected to gates of P channel MOS transistors 48 and 50 via inverters 51–53.

Each of differential amplifiers 41–43 includes P channel MOS transistors 54 and 55 and N channel MOS transistors 56 and 57. MOS transistors 54 and 56 and MOS transistors 55 and 57 are serially connected between power supply node N54 and the line of ground potential Vss. Gates of P channel MOS transistors 54 and 55 are both connected to the drain of P channel MOS transistor 54 (node N56). The node between MOS transistors 55 and 57 becomes output node N55.

Gates of N channel MOS transistors 56 and 57 of differential amplifier 41 respectively receive an internal reference potential intVR (2V) as well as an external reference potential extVR (1.65V or 2.9V). Internal reference potential intVR is generated within the semiconductor integrated circuit device. External reference potential extVR is supplied to the semiconductor integrated circuit device from the outside.

Gates of N channel MOS transistors 56 and 57 of differential amplifier 42 respectively receive external reference potential extVR and input signal VI. In differential amplifier 42, the gate width of N channel MOS transistors 56 and 57 is formed to be relatively smaller compared with the gate width of P channel MOS transistors 54 and 55. When the gates of N channel MOS transistors 56 and 57 receive 2.9V, node N55 attains to intermediate potential Vdd/2.

Gates of N channel MOS transistors 56 and 57 of differential amplifier 43 respectively receive external reference potential extVR and input signal VI. In differential amplifier 43, the gate width of N channel MOS transistors 56 and 57 is made relatively larger compared with the gate width of P channel MOS transistors 54 and 55. When gates of N channel MOS transistors 56 and 57 receive 1.65V, node N55 attains to intermediate potential Vdd/2.

The operation of the input buffer is next described. The input buffer is activated when activation signal/SEL falls to "L" level of the activation level.

When terminal potential Vtt is equal to power supply potential Vdd (3.3V) and reference potential VR is 2.9V (the state shown in FIG. 15), external reference potential extVR is higher than internal reference potential intVR, so that output node N55 of differential amplifier 41 becomes "L" level. P channel MOS transistor 48 is then rendered non-conductive to allow differential amplifier 43 to be inactivated, and P channel MOS transistor 46 is rendered conductive to allow differential amplifier 42 to be activated. At the same time, P channel MOS transistor 50 becomes nonconductive to separate differential amplifier 43 from output node N50 of the input buffer, and P channel MOS transistor 49 becomes conductive to couple differential amplifier 42 with output node N50 of the input buffer.

When input signal VI rises to "H" level (3.3V), the resistance value of N channel MOS transistor 57 of differential amplifier 42 becomes lower than the resistance value of N channel MOS transistor 56, so that output signal VO falls to "L" level. When input signal VI falls to "L" level (2.5V), the resistance value of N channel MOS transistor 57 of differential amplifier 42 becomes higher than the resistance value of N channel MOS transistor 56, so that output signal VO rises to "H" level.

When terminal potential Vtt and reference potential VR are equal to intermediate potential Vdd/2 (1.65V) (the state shown in FIG. 14), external reference potential extVR is lower than internal reference potential intVR, and output node N55 of differential amplifier 41 attains to "H" level. In response, P channel MOS transistor 46 is rendered nonconductive to inactivate differential amplifier 42, and P channel MOS transistor 48 is rendered conductive to activate differential amplifier 43. At the same time, P channel MOS transistor 49 becomes nonconductive to separate differential amplifier 42 from output node N50 of the input buffer, and P channel MOS transistor 50 becomes conductive to couple differential amplifier 43 with output node N50 of the input buffer.

When input signal VI rises to "H" level (2.05V), the resistance value of N channel MOS transistor 57 of differential amplifier 43 becomes lower than that of N channel MOS transistor 56, and output signal VO falls to "L" level. When input signal VI falls to "L" level (1.25V), the resistance value of N channel MOS transistor 57 of differential amplifier 43 becomes higher than that of N channel MOS transistor 56, and output signal VO rises to "H" level.

According to this embodiment, an effect similar to that of the first embodiment can be obtained.

(Fourth Embodiment)

Figure 9:
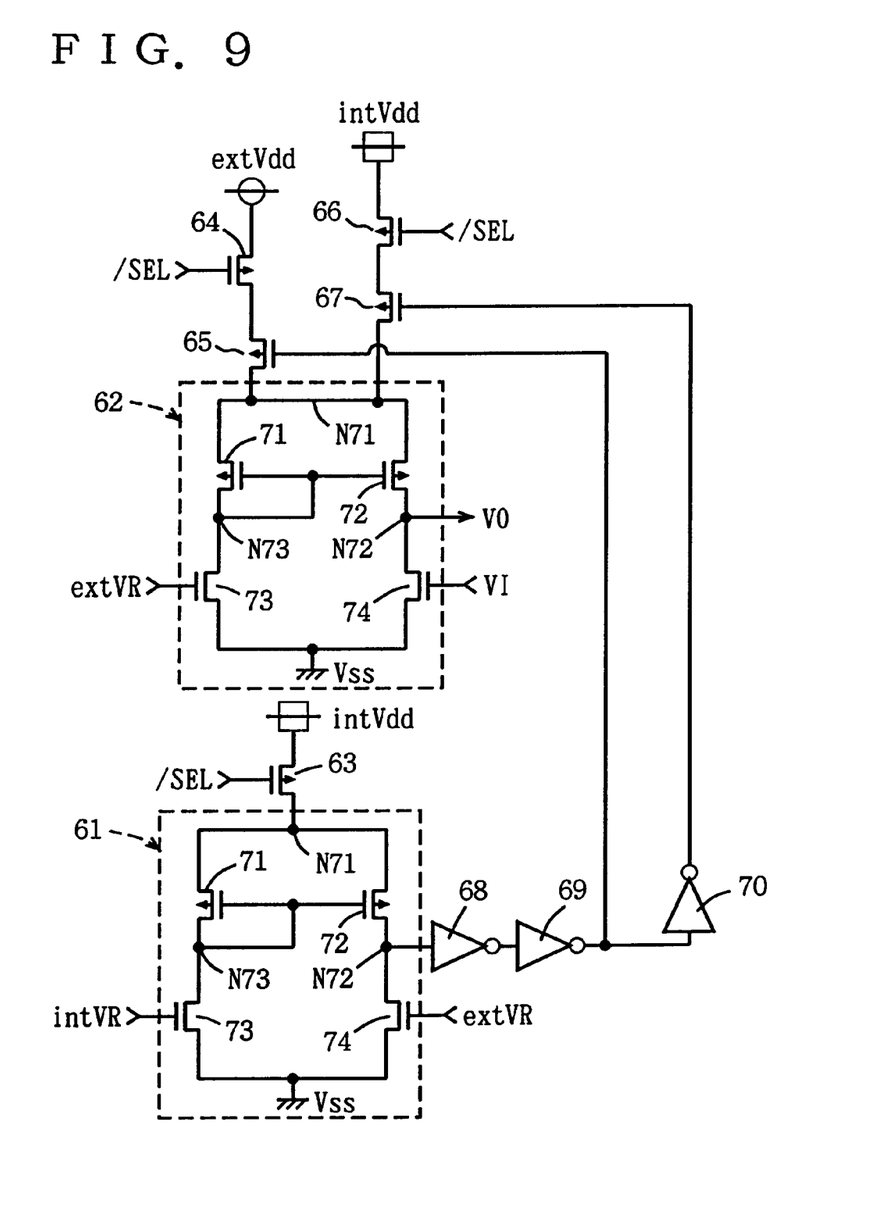

FIG. 9 is a circuit diagram illustrating an input buffer of a semiconductor integrated circuit device according to the fourth embodiment.

With reference to FIG. 9, this input buffer includes two differential amplifiers 61 and 62, P channel MOS transistors 63–67, and inverters 68–70. P channel MOS transistor 63 is connected between the line of internal power supply potential intVdd (2V) and a power supply node N71 of differential amplifier 61. P channel MOS transistors 64 and 65 are serially connected between the line of external power supply potential extVdd (3.3V) and power supply node N71 of differential amplifier 62. Internal power supply potential intVdd is generated within the semiconductor integrated circuit device. External power supply potential extVdd is supplied to the semiconductor integrated circuit device from the outside.

P channel MOS transistors 66 and 67 are serially connected between the line of internal power supply potential intVdd and power supply node N71 of differential amplifier 62. Gates of P channel MOS transistors 63, 64 and 66 all receive activation signal/SEL. An output node N72 of differential amplifier 61 is connected to the gate of P channel MOS transistor 65 via inverters 68 and 69, and connected to the gate of P channel MOS transistor 67 via inverters 68–70.

Each of differential amplifiers 61 and 62 includes P channel MOS transistors 71 and 72 as well as N channel MOS transistors 73 and 74. MOS transistors 71 and 73 and MOS transistors 72 and 74 are serially connected between power supply node N71 and the line of ground potential Vss respectively. The gates of P channel MOS transistors 71 and 72 are both connected to the drain of P channel MOS transistor 71 (node N73). The node between MOS transistors 72 and 74 is output node N72.

The gates of N channel MOS transistors 73 and 74 of differential amplifier 61 respectively receive internal reference potential intVR (2V) and external reference potential extVR (1.65V or 2.9V). Internal reference potential intVR is generated within the semiconductor integrated circuit device. External reference potential extVR is supplied to the semiconductor integrated circuit device from the outside.

The gates of N channel MOS transistors 73 and 74 of differential amplifier 62 respectively receive external reference potential extVR and input signal VI. Differential amplifier 62 is structured such that the potential at node N72, when the gates of N channel MOS transistors 73 and 74 are supplied with 2.9V and power supply node N71 is supplied with external power supply potential extVdd (3.3V), is the same as the potential at node N72 when the gates of N channel MOS transistors 73 and 74 are supplied with 1.65V and power supply node N71 is supplied with internal power supply potential intVdd (2V).

The operation of this input buffer is described below. The input buffer is activated when activation signal/SEL falls to "L" level of the activation level.

When terminal potential Vtt is equal to external power supply potential extVdd (3.3V) and external reference potential extVR is 2.9V (the state shown in FIG. 15), external reference potential extVR is higher than internal reference potential intVR, so that output node N72 of differential amplifier 61 becomes "L" level. In response, P channel MOS transistor 65 is rendered conductive and P channel MOS transistor 67 is rendered nonconductive, and external power supply potential extVdd is supplied to power supply node N71 of differential amplifier 62. Differential amplifier 62 outputs "L" level when input signal VI rises to "H" level, and outputs "H" level when input signal VI falls to "L" level.

When terminal potential Vtt and external reference potential extVR are equal to intermediate potential extVdd/2 (1.65V) (the state shown in FIG. 14), external reference potential extVR is lower than internal reference potential intVR, so that output node N72 of differential amplifier 61 becomes "H" level. In response, P channel MOS transistor 67 becomes conductive and P channel MOS transistor 65 becomes nonconductive, and internal power supply potential intVdd is supplied to power supply node N71 of differential amplifier 62. Differential amplifier 62 outputs "L" level when input signal VI rises to "H" level, and outputs "H" level when input signal VI falls to "L" level.

According to this embodiment, an effect similar to that according to the first embodiment can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input buffer of a semiconductor device in which a first potential between first and second power supply potentials or a second potential between said first power supply potential and said first potential is supplied as an external reference potential, an external signal formed of a low amplitude logic signal overlapping said first or second potential is supplied, said external signal is compared with said external reference potential, and an internal signal according to a result of the comparison is supplied to an internal circuit, comprising:

signal conversion means for converting said external signal formed of said low amplitude logic signal overlapping said first or second potential to a signal formed of a complementary signal of said low amplitude logic signal overlapping said second or first potential;

potential conversion means for converting said first or second potential supplied as said external reference potential to said second or first potential;

first and second transistors serially connected between a first node and a line of said second power supply potential, with an input electrode of one transistor receiving said external reference potential, and an input electrode of the other transistor receiving an output signal from said signal conversion means;

third and fourth transistors serially connected between a second node from which said internal signal is output and a line of said second power supply potential, with an input electrode of one transistor receiving said external signal and an input electrode of the other transistor receiving an output potential from said potential conversion means; and a current mirror circuit connected between a line of a third power supply potential and said first and second nodes, which supplies current which is equal to that flowing through said first node to said second node.

2. The input buffer of the semiconductor device according to claim 1, wherein said signal conversion means includes a fifth transistor having an input electrode receiving said external signal, a first electrode receiving said second power supply potential, and a second electrode outputting the converted signal, and a first resistance element connected between said second electrode of said fifth transistor and a line of said first power supply potential; and said potential conversion means includes a sixth transistor having an input electrode receiving said external reference potential, a first electrode receiving said second power supply potential, and a second electrode outputting the converted potential, and a second resistance element connected between said second electrode of said sixth transistor and a line of said first power supply potential.

3. The input buffer of the semiconductor device according to claim 2, further comprising:

seventh and eighth transistors serially connected between said first node and a line of said second power supply potential, with an input electrode of one transistor receiving the output signal from said signal conversion means, and an input electrode of the other transistor receiving said external reference potential; and ninth and tenth transistors serially connected between said second node and a line of said second power supply potential, with an input electrode of one transistor receiving the output potential from said potential conversion means, and an input electrode of the other transistor receiving said external signal.

4. The input buffer of the semiconductor device according to claim 2, wherein said third power supply potential is said first power supply potential.

5. The input buffer of the semiconductor device according to claim 2, wherein said third power supply potential is a stabilized potential between said first and second power supply potentials, and the input buffer further comprises stabilized potential generating means receiving said first and second power supply potentials for generating said stabilized potential.

6. The input buffer of the semiconductor device according to claim 1, further comprising:

fifth and sixth transistors serially connected between said first node and a line of said second power supply potential, with an input electrode of one transistor receiving an output signal from said signal conversion means, and an input electrode of the other transistor receiving said external reference potential; and seventh and eighth transistors serially connected between said second node and a line of said second power supply potential, with an input electrode of one transistor receiving an output potential from said potential conversion means, and an input electrode of the other transistor receiving said external signal.

7. A semiconductor device comprising:

a first shifter receiving an external signal having a first threshold value between high and low logical levels, for generating a shift signal having a second threshold value decreasing as the first threshold value increases;

a second shifter receiving an external reference potential, for generating an internal reference potential decreasing as the external reference potential increases;

a first transistor having a drain connected to a first node, and a gate receiving one of the external reference potential and the shift signal;

a second transistor connected between a source of said first transistor and a line of a first power supply potential, and having a gate receiving the other of the external reference potential and the shift signal;

a third transistor having a drain connected to a second node from which an internal signal according to the external signal is generated, and a gate receiving one of the external signal and the internal reference potential;

a fourth transistor connected between a source of said third transistor and a line of the first power supply potential, and having a gate receiving the other of the external signal and the internal reference potential; and a current mirror circuit connected between a line of a second power supply potential and the first node, and between the line of the second power supply potential and the second node, for supplying the first and second nodes with current.

8. The semiconductor device according to claim 7, wherein the first power supply potential is ground potential.

9. The semiconductor device according to claim 7, wherein said first shifter is disabled in response to an enable signal.

10. The semiconductor device according to claim 7, wherein said second shifter is disabled in response to an enable signal.

11. The semiconductor device according to claim 7, wherein said first and second shifters are supplied with a third power supply potential different from the first and second power supply potentials.

12. The semiconductor device according to claim 11, wherein the third power supply potential is an external power supply potential supplied to said semiconductor device, and said semiconductor device further comprises an internal power supply potential generator receiving the external power supply potential for generating the second power supply potential.

13. The semiconductor device according to claim 7, further comprising:

a fifth transistor having a drain connected to the first node, and a gate receiving said other of the external reference potential and the shift signal;

a sixth transistor connected between a source of said fifth transistor and a line of the first power supply potential, and having a gate receiving said one of the external reference potential and the shift signal;

a seventh transistor having a drain connected to the second node, and a gate receiving said other of the external signal and the internal reference potential; and an eighth transistor connected between a source of said seventh transistor and a line of the first power supply potential, and having a gate receiving said one of the external signal and the internal reference potential.

* * * * *